(12) United States Patent
Hong et al.

(10) Patent No.: US 8,557,620 B2
(45) Date of Patent: Oct. 15, 2013

(54) METHOD OF MANUFACTURING A DISPLAY SUBSTRATE AND METHOD OF MANUFACTURING A DISPLAY APPARATUS USING THE SAME

(75) Inventors: Pil-Soon Hong, Gyeonggi-do (KR); Jung-In Park, Gyeonggi-do (KR); Hi-Kuk Lee, Gyeonggi-do (KR)

(73) Assignee: Samsung Display Co., Ltd. (KR)

( * ) Notice: Subject to any disclaimer, the term of this patent is extended or adjusted under 35 U.S.C. 154(b) by 84 days.

(21) Appl. No.: 12/421,555

(22) Filed: Apr. 9, 2009

(65) Prior Publication Data

US 2009/0280591 A1 Nov. 12, 2009

(30) Foreign Application Priority Data

May 8, 2008 (KR) .............................. 10-2008-42683

(51) Int. Cl.
*H01L 21/00* (2006.01)
(52) U.S. Cl.
USPC ...................................... 438/34; 257/E21.411
(58) Field of Classification Search
USPC ...................................... 438/34; 257/E21.411
See application file for complete search history.

(56) References Cited

U.S. PATENT DOCUMENTS

| | | | | |
|---|---|---|---|---|
| 5,275,695 A * | 1/1994 | Chang et al. | ..................... | 216/27 |
| 7,268,842 B2 * | 9/2007 | Sawasaki et al. | ............. | 349/106 |
| 7,335,542 B2 * | 2/2008 | Makiyama et al. | ........... | 438/182 |
| 2004/0100596 A1 * | 5/2004 | Lan et al. | ....................... | 349/110 |
| 2005/0145161 A1 * | 7/2005 | White | .............................. | 114/358 |
| 2006/0006385 A1 * | 1/2006 | Park | ..................................... | 257/59 |
| 2006/0145161 A1 * | 7/2006 | Lee et al. | .......................... | 257/72 |
| 2008/0169470 A1 * | 7/2008 | Lim et al. | .......................... | 257/59 |
| 2008/0169471 A1 * | 7/2008 | Shin et al. | ......................... | 257/59 |
| 2008/0193718 A1 * | 8/2008 | Suwa et al. | .................... | 428/156 |

FOREIGN PATENT DOCUMENTS

| | | |
|---|---|---|
| JP | 2004-335775 A | 11/2004 |
| KR | 100209406 B1 | 4/1999 |
| KR | 1020060022464 A | 3/2006 |
| KR | 1020070054505 A | 5/2007 |

* cited by examiner

*Primary Examiner* — William D Coleman
*Assistant Examiner* — Christine Enad
(74) *Attorney, Agent, or Firm* — Innovation Counsel LLP (57) ABSTRACT

Provided is a method of manufacturing a display substrate. In the method, a gate line, a data line crossing the gate line, and a switching device are formed on a base substrate. A passivation layer, a first resist layer and a second resist layer are formed on the base substrate. The first resist layer and the second resist layer are patterned to form a resist pattern and an etch-stop pattern, the etch-stop pattern having a sidewall protruding from a sidewall of the resist pattern. A portion of the passivation layer is removed to form a contact hole on a drain electrode of the switching device. A pixel electrode electrically connected to the switching device through the contact hole is formed. Thus, an undercut between an etch-stop pattern and a resist pattern may be more easily formed without over-etching a passivation layer.

17 Claims, 6 Drawing Sheets

METHOD OF MANUFACTURING A DISPLAY SUBSTRATE AND METHOD OF MANUFACTURING A DISPLAY APPARATUS USING THE SAME

PRIORITY STATEMENT

This application claims priority under 35 U.S.C. §119 to Korean Patent Application No. 2008-42683, filed on May 8, 2008 in the Korean Intellectual Property Office (KIPO), the contents of which are herein incorporated by reference in their entirety.

BACKGROUND OF THE INVENTION

1. Field of the Invention

Exemplary embodiments of the invention relate generally to flat panel displays. More particularly, exemplary embodiments of the invention relate to a method of manufacturing a display substrate and a liquid crystal display (LCD) apparatus using the display substrate.

2. Description of the Related Art

Generally, a liquid crystal display (LCD) panel includes a display substrate, an opposing substrate facing the display substrate, and a liquid crystal layer interposed between the display substrate and the opposing substrate. The display substrate includes a plurality of switching devices for driving pixels. The LCD panel applies a voltage to the liquid crystal layer to control light transmittance in order to display an image.

The display substrate may be manufactured through a five-mask process that includes forming a gate pattern, forming a semiconductor pattern having a semiconductor layer and an ohmic contact pattern, forming a source pattern, forming a contact portion and forming a pixel electrode. Since manufacturing costs for masks are high, a four-mask process and a three-mask process have been developed in order to reduce the number of masks required for manufacturing the display substrate.

When the display substrate is manufactured through a typical three-mask process, the semiconductor pattern and the source pattern are patterned through the same mask, and the contact portion and the pixel electrode are patterned through the same mask. As a result, two masks may be omitted in comparison to the five-mask process.

When the display substrate is manufactured through the typical three-mask process, passivation layers may be excessively etched during photoresist lift off. Thus, the metal layers of the display substrate may be damaged. In order to solve the above-mentioned problems, a method of changing manufacturing conditions, a method of using negative photoresist and a method of structurally changing the contact portion and other such methods have been developed. However, the process margins for the above mentioned lift-off processes may not be sufficient. Therefore, there is a need for a method that enhances the reliability and the process margins for lift-off processes.

SUMMARY OF THE INVENTION

Example embodiments of the present invention provide a method of manufacturing a display substrate capable of improving the reliability and the process margin for a given lift-off process.

Example embodiments of the present invention provide a method of manufacturing both a display substrate and a display apparatus using such a substrate.

In one aspect of the invention, a method of manufacturing a display substrate comprises forming a gate line, a data line crossing the gate line, and a switching device on a base substrate, the switching device electrically connected to the gate line and the data line. A passivation layer, a first resist layer, and a second resist layer are then sequentially formed on the base substrate. Then, the first resist layer and the second resist layer are patterned to form a resist pattern and an etch-stop pattern, the etch-stop pattern having a sidewall protruding over a sidewall of the resist pattern. A portion of the passivation layer is removed, where the removed portion is exposed through the resist pattern and the etch-stop pattern, to form a contact hole on a drain electrode of the switching device. Finally, a pixel electrode is formed, where the pixel electrode is electrically connected to the switching device through the contact hole.

In another aspect of the invention, a method of manufacturing a display apparatus comprises, on a first base substrate, forming a gate line, a data line crossing the gate line, and a switching device electrically connected to the gate line and the data line.

sequentially forming a passivation layer, a first resist layer and a second resist layer on the first base substrate;

patterning the first resist layer and the second resist layer to form a resist pattern and an etch-stop pattern, the etch-stop pattern having a sidewall protruding from a sidewall of the resist pattern;

removing a portion of the passivation layer, which is exposed through the resist pattern and the etch-stop pattern, to form a contact hole on a drain electrode of the switching device;

forming a pixel electrode electrically connected to the switching device through the contact hole; and forming a common electrode layer on a second base substrate, wherein the second base substrate is facing the first base substrate.

BRIEF DESCRIPTION OF THE DRAWINGS

The above and other features and advantages of the present invention will become more apparent by describing in detailed example embodiments thereof with reference to the accompanying drawings.

DETAILED DESCRIPTION OF THE INVENTION

The present invention is described more fully hereinafter with reference to the accompanying drawings, in which example embodiments of the present invention are shown. The present invention may, however, be embodied in many different forms and should not be construed as being limited to the example embodiments as set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as being limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 1:
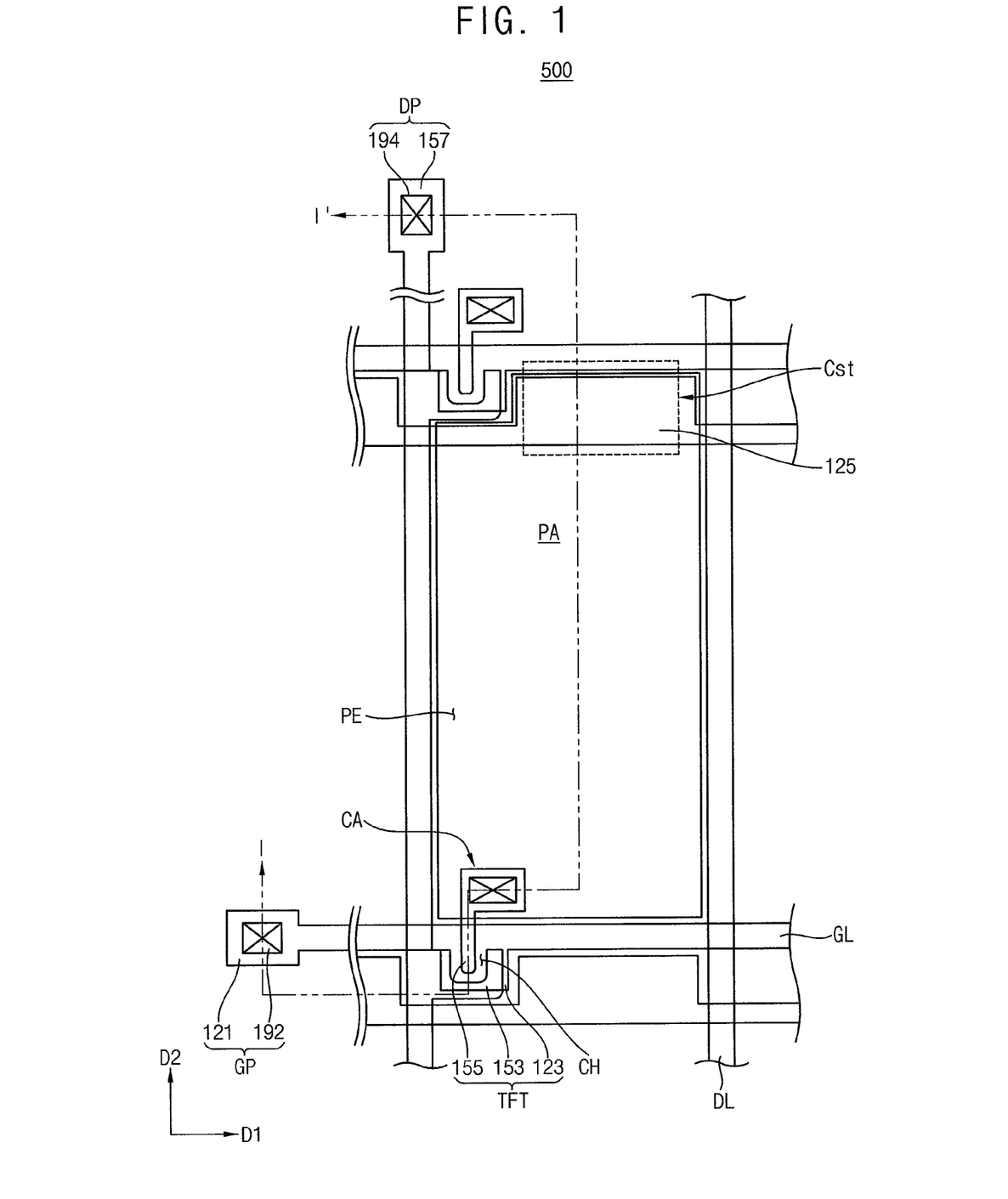
FIG. 1 is a plan view illustrating a display panel according to an example embodiment of the present invention.
Figure 2:
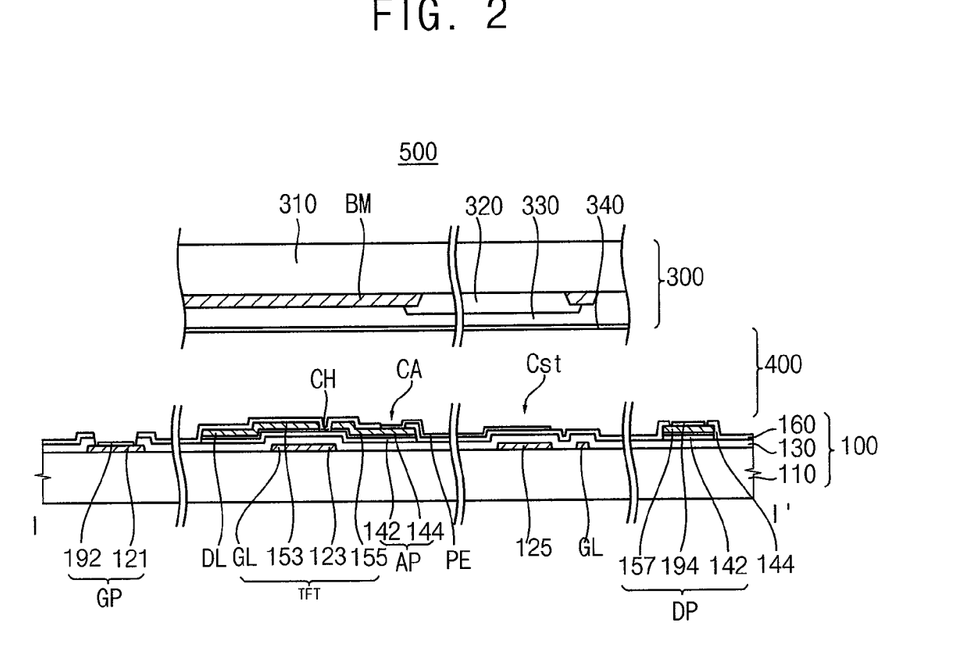
FIG. 2 is a cross-sectional view taken along a line I-I' of FIG. 1.

FIG. 1 is a plan view illustrating a display panel according to an example embodiment of the present invention. FIG. 2 is a cross-sectional view taken along a line I-I' of FIG. 1.

Referring to FIGS. 1 and 2, a display panel 500 includes a display substrate 100, an opposing substrate 300 and a liquid crystal layer 400. The opposing substrate 300 faces the display substrate 100. The liquid crystal layer 400 is interposed between the display substrate 100 and the opposing substrate 300.

The display substrate 100 may include a gate line GL, a gate pad GP, a data line DL, a data pad DP, a storage line 125, a switching device TFT and a pixel electrode PE, which are formed on a first base substrate 110. The display substrate 100 may further include a gate insulation layer 130 and a passivation layer 160, which are formed on the first base substrate 110.

The first base substrate 110 includes a transparent material so that light may pass through the first base substrate 110. Examples of a material that may be used for the first base substrate 110 may include glass.

The gate line GL extends in a first direction D1 of the display substrate 100, and a plurality of gate lines is arranged in a second direction D2 different from the first direction D1. For example, the first direction D1 may be substantially perpendicular to the second direction D2.

The gate pad GP is formed at an end of the gate line GL, and includes a gate pad electrode 121 electrically connected to the gate line GL and a first transparent electrode 192 electrically connected to the gate pad electrode 121.

The data line DL extends in the second direction D2, and a plurality of data lines is arranged in the first direction D1.

The data pad DP is formed at an end of the data line DL, and includes a data pad electrode 157 electrically connected to the data line DL, as well as a second transparent electrode 194 electrically connected to the data pad electrode 157.

The storage line 125 is formed in a pixel area PA, in which the pixel electrode PE is disposed, and is adjacent to the gate line GL. The storage line 125 is overlapped with the pixel electrode PE and forms a storage capacitor Cst.

The switching device TFT includes a gate electrode 123, an active pattern AP (illustrated in FIG. 2), a source electrode 153, and a drain electrode 155. The gate electrode 123 is electrically connected to the gate line GL. The source electrode 153 is electrically connected to the data line DL. The drain electrode 155 is spaced apart from the source electrode 153. A channel portion CH may be defined by an area between the source electrode 153 and the drain electrode 155, wherein the area exposes the active pattern AP of the switching device TFT. The pixel electrode PE may make contact with the drain electrode 155 in a contact area CA, so that the switching device TFT may be electrically connected to the pixel electrode PE.

The gate insulation layer 130 is formed on the first base substrate 110 having the gate line GL, the gate pad electrode 121, the gate electrode 123 and the storage line 125. Examples of a material that may be used for the gate insulation layer 130 may include silicon nitride, silicon oxide, and the like. The gate insulation layer 130 may have a hole exposing the gate pad electrode 121.

The active pattern AP is formed on the gate electrode 123, and overlaps the gate electrode 123. Furthermore, the active pattern AP is disposed under the source electrode 153 and the drain electrode 155. The active pattern AP includes a semiconductor layer 142 and an ohmic contact layer 144. For example, the semiconductor layer 142 may include amorphous silicon, and the ohmic contact layer 144 may include $n^+$ amorphous silicon, into which n-type impurities are implanted at a high concentration.

The passivation layer 160 is formed over the data line DL, the data pad electrode 157, the source electrode 153 and the drain electrode 155. Examples of a material that may be used for the passivation layer 160 may include silicon nitride, silicon oxide, and the like. The passivation layer 160 has holes exposing the drain electrode 155 in the contact area CA, a portion of the gate pad electrode 121, and a portion of the data pad electrode 157.

The first transparent electrode 192 of the gate pad GP makes contact with the exposed portion of the gate pad electrode 121, so as to electrically connect to the gate line GL. The second transparent electrode 194 of the data pad DP makes contact with the exposed portion of the data pad electrode 157, so as to electrically connect to the data line DL.

The gate insulation layer 130 and the passivation layer 160, which are interposed between the storage line 125 and the pixel electrode PE, may together serve as a dielectric substance. Thus, a voltage may be charged between the storage line 125 and the pixel electrode PE, which may serve as electrodes.

The opposing substrate 300 includes a black matrix pattern BM, a color filter 320, an overcoating layer 330, and a common electrode layer 340, each of which are formed on a second base substrate 310.

The black matrix pattern BM is formed so that the black matrix pattern BM may overlap the gate line GL, the data line DL, and the switching device TFT. The black matrix pattern BM may block light incident to the opposing substrate 300 through the display substrate 100 and the liquid crystal layer 400. The black matrix pattern BM may be formed, for example, through printing an organic material or through patterning a metal layer using a photolithography process.

The color filter 320 is formed on the second base substrate 310 in areas not covered by the black matrix pattern BM. The color filter 320 may be formed on the second base substrate 310 corresponding to the pixel electrode area PA of the first base substrate 110. The color filter 320 may be formed, for example, through printing an organic material or through patterning a color photoresist layer using a photolithography process.

The overcoating layer 330 is formed on the second base substrate 310 over the black matrix pattern BM and the color filter 320. The overcoating layer 330 may have a sufficient thickness to planarize the opposing substrate 300. Additionally, the overcoating layer 330 may include an aryl resin.

The common electrode layer 340 is formed on the second base substrate 310 over the overcoating layer 330. The common electrode layer 340 faces the pixel electrode PE so that an electric field may be generated between the common electrode layer 340 and the pixel electrode PE. Examples of a material that may be used for the common electrode layer 340 may include indium tin oxide (ITO), indium zinc oxide (IZO), and the like.

Hereinafter, a method of manufacturing a display substrate according to an example embodiment of the present invention will be explained in detail with reference to FIGS. 3 to 11.

Figure 3:
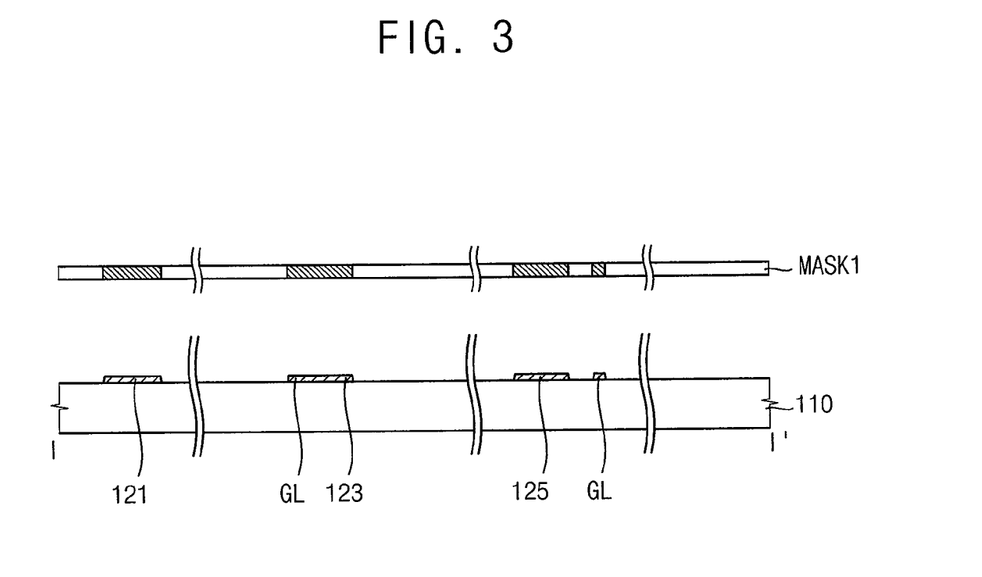
FIGS. 3 to 11 are cross-sectional views illustrating a method of manufacturing a display substrate according to an example embodiment of the present invention.

FIGS. 3 to 11 are cross-sectional views illustrating the method of manufacturing a display substrate illustrated in FIG. 2. Particularly, FIG. 3 is a cross-sectional view illustrating a process of patterning a gate metal layer using a first mask.

Referring to FIG. 3, a gate line GL, a gate pad electrode 121, a gate electrode 123, and a storage line 125 are formed on a first base substrate 110. This may be accomplished, for example, by first forming a gate metal layer on the first base substrate 110. A first photoresist film is formed over the gate metal layer, and a first mask MASK1 is disposed on the first photoresist film. Light is irradiated onto the first photoresist film through the first mask MASK1. Thereafter, the first photoresist film is developed to form a first photoresist pattern. The gate metal layer is etched by using the first photoresist pattern as an etching mask to form the gate line GL, the gate pad electrode 121, the gate electrode 123 and the storage electrode 125 on the first base substrate 110. For example, the first photoresist film may include a positive photoresist material.

Figure 4:
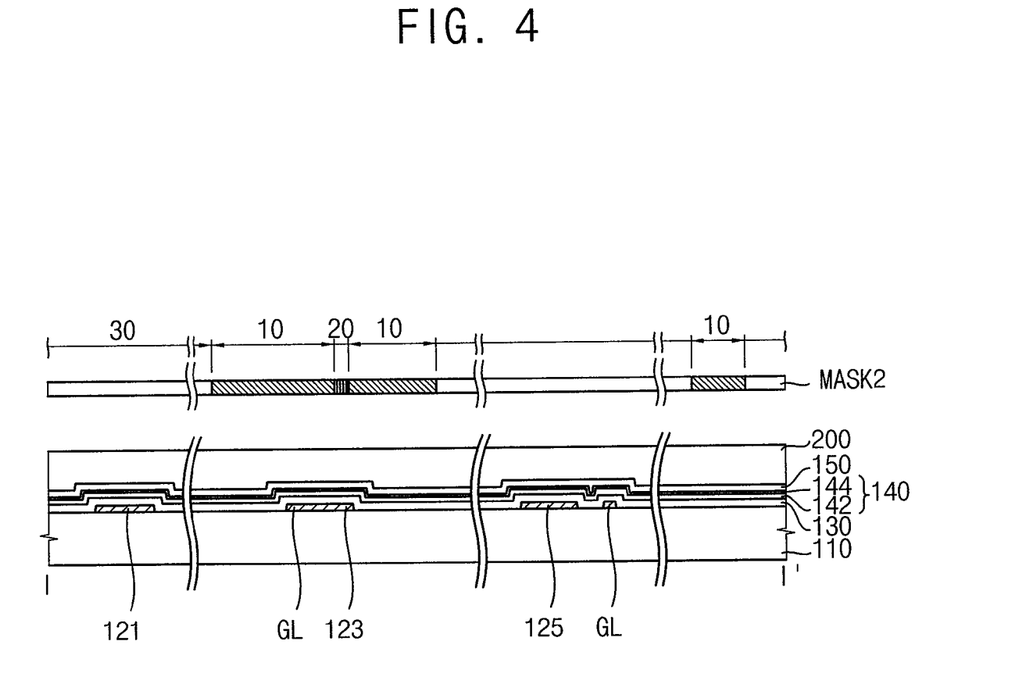
Figure 5:
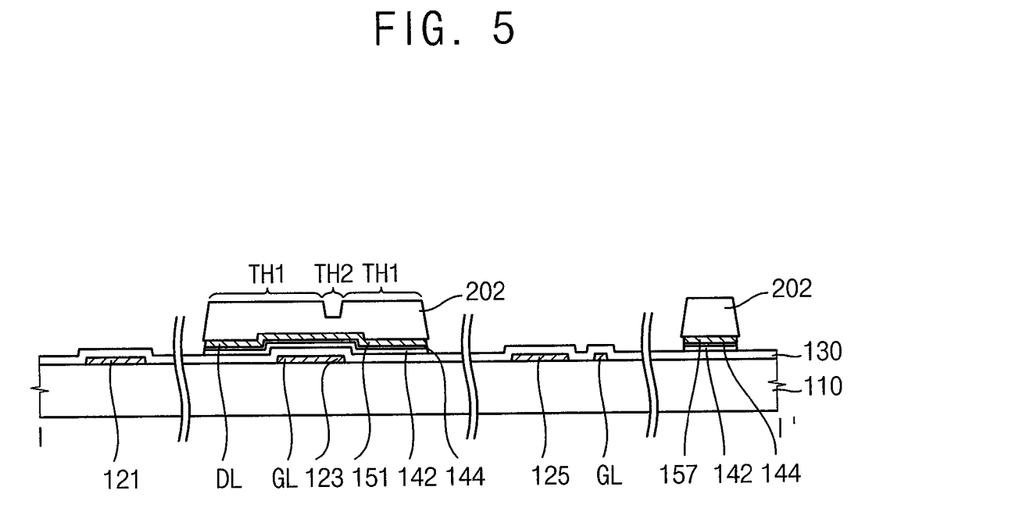
Figure 6:
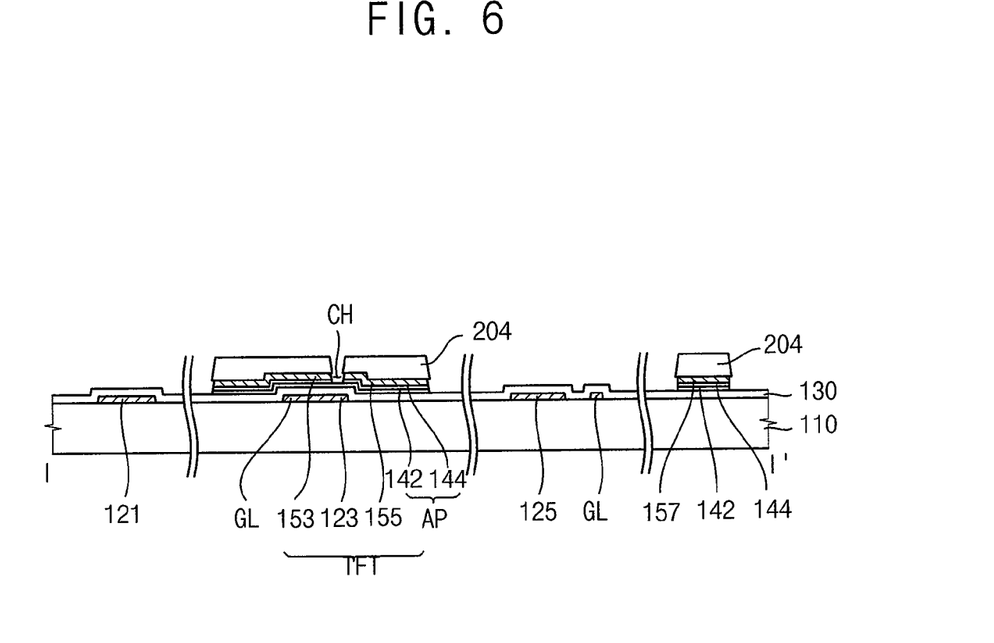

FIGS. 4 to 6 are cross-sectional views illustrating a process of patterning an active layer and a data metal layer by using a second mask. Referring to FIG. 4, a gate insulation layer 130, an active layer 140 and a data metal layer 150 are sequentially formed over the gate line GL, the gate pad electrode 121, the gate electrode 123 and the storage electrode 125. The active layer 140 includes a semiconductor layer 142 and an ohmic contact layer 144. A second photoresist film 200 is formed on the data metal layer 150, and a second mask MASK2 is disposed over the second photoresist film 200.

As one example, the second photoresist film 200 may include a positive photoresist material. The second mask may be a slit mask having a light-blocking portions 10, slit portions 20, and light-transmitting portions 30. The light-blocking portions 10 may block light provided to areas in which a data line DL, a source electrode 153, a drain electrode 155, and a data pad electrode 157 are formed. The slit portions 20 partially transmit light provided to areas in which channel portions CH are formed. The light-transmitting portion 30 fully transmits light.

Referring to FIG. 5, the second photoresist film 200 is patterned to form a second photoresist pattern 202. The data line DL, a switching pattern 151 and the data pad electrode 157 are formed using the second photoresist pattern 202. The second photoresist pattern 202 includes a first thickness portion TH1 and a second thickness portion TH2, and exposes a pixel electrode area PA and the gate insulation layer 130 formed on the gate line GL.

The portion of the second photoresist film 200 which is shielded from light by the light-blocking portion 10 remains on the first base substrate 110 to form the first thickness portion TH1. The first thickness portion TH1 overlaps with the area in which the data line DL, the source electrode 153, the drain electrode 155 and the data pad electrode 157 are formed.

The portion of the second photoresist film 200, which is exposed to light through the slit portion 20, remains on the first base substrate 110 to form the second thickness portion TH2. The second thickness portion TH2 overlaps with the area in which the channel portion CH is formed. The thickness of the second thickness portion TH2 is less than the thickness of the first thickness portion TH1.

Thereafter, the data metal layer 150 and the active layer 140 are etched using the second photoresist pattern 202 as an etching mask, so as to form the data line DL, the switching pattern 151 and the data pad electrode 157. For example, the data metal layer 150 may be etched through a wet etching process using an etching solution, and the active layer 140 may be etched through a dry etching process using an etching gas. The data pad electrode 157 and the switching pattern 151 are electrically connected to the data line DL. Patterned semiconductor layer 142 and patterned ohmic contact layer 144 remain under the data line DL, the switching pattern 151 and the data pad electrode 157.

Referring to FIG. 6, a portion of the second photoresist pattern 202 is removed so that the thickness of the second photoresist pattern 202 may be reduced. As a result, the switching pattern 151 is exposed through a remaining portion 204 of the second photoresist pattern 202. For example, the portion of the second photoresist pattern 202 may be removed through an ashing process using oxygen. The thickness of the removed portion of the photoresist pattern 202 may be substantially the same as the thickness of the second thickness portion TH2.

The exposed portions of the switching pattern 151 are then removed. For example, the switching pattern 151 may be etched through a wet etching process using an etching solution. When these portions of the switching pattern 151 are removed, the ohmic contact layer 144 of the channel portion CH is exposed so that the source electrode 153 and the drain electrode 155, which are spaced apart from each other, are formed. Alternatively, the switching pattern 151 may be etched through a dry etching process using an etching gas, in order to prevent the switching pattern 151 from being excessively etched.

Next, the exposed portion of the ohmic contact layer 144 is removed. Thus, the semiconductor layer 142 of the channel portion CH is exposed. Thus, the active pattern AP is formed under the source electrode 153 and the drain electrode 155, and a switching device TFT, including the gate electrode 123, the source electrode 153 and the drain electrode 155, is formed.

Figure 7:
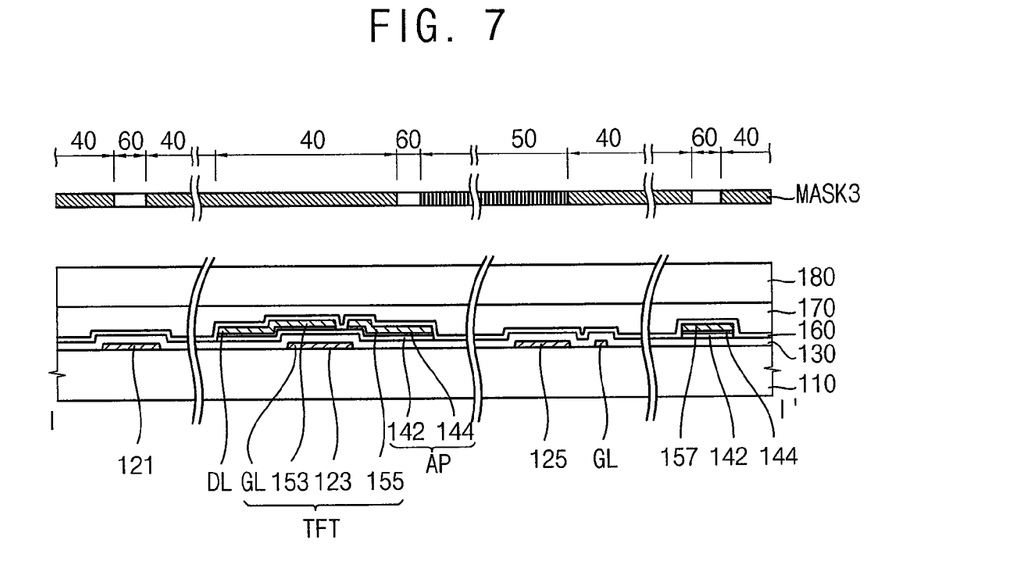

FIGS. 7 to 11 are cross-sectional views illustrating a process of patterning a passivation layer and a transparent electrode layer by using a third mask. Referring to FIG. 7, a passivation layer 160 is formed over the data line DL, the source electrode 153, the drain electrode 155 and the data pad electrode 157. A first resist film 170 and a second resist film 180 are then sequentially formed over the passivation layer 160.

The first resist film 170 may include a non-photosensitive resist composition, and the second resist film 180 may include a photosensitive resist composition. For example, the non-photosensitive resist composition may include an alkali-soluble polymer and an organic solvent. The alkali-soluble polymer includes a repeating unit containing a hydroxyl group or a carboxyl group. For example, the repeating unit of the alkali-soluble polymer may contain an alcohol hydroxyl group or a phenol hydroxyl group. The alkali-soluble polymer includes a plurality of repeating units repeatedly coupled to each other. The alkali-soluble polymer is soluble in an alkali solution.

When the average molecular weight of the alkali-soluble polymer is less than about 3,000 g/mol, controlling a developing speed of the first resist layer 170 formed from the non-photosensitive resist composition may be difficult, and forming a film on the passivation layer 160 may be difficult. When the average molecular weight of the alkali-soluble polymer is greater than about 30,000 g/mol, developing the first resist film 170 may be difficult, and uniformly coating the non-photosensitive resist composition may be difficult. Thus, the average molecular weight of the alkali-soluble polymer may be preferably about 3,000 to about 30,000 g/mol.

The organic solvent of the non-photosensitive resist composition dissolves the alkali-soluble polymer. Examples of the organic solvent may include an alcohol such as methanol, ethanol and the like; a glycol ether; an alkylene glycol alkyl ether acetate; a diethylene glycol; a monoalkyl ether; an aromatic hydrocarbon; a ketone; an ester such as 3-hydroxypropionic acid methyl, 2-hydroxy-3-methylbutanoic acid methyl; methoxyacetic acid methyl and the like. These can be used alone or in any suitable combination.

The photosensitive resist composition includes an alkali-soluble resin, a photoreactive compound and an organic solvent. Examples of the photosensitive resist composition may include a conventional positive photoresist composition used for a photography process.

The alkali-soluble resin includes a repeating unit containing a phenol hydroxyl group. For example, a phenol-based compound and an aldehyde compound may be reacted with each other in the presence of an acidic catalyst to prepare the alkali-soluble resin. Examples of the phenol-based compound may include phenol, o-cresol, m-cresol, p-cresol and the like. These can be used alone or in any suitable combination. Examples of the aldehyde compound may include formaldehyde, formalin, p-formaldehyde, trioxane and the like. These can be used alone or in any suitable combination.

The photoreactive compound may generate Bronsted acid and/or Lewis acid. Examples of the photoreactive compound may include an onium salt, a halogenated organic compound, a quinone diazide compound, a bis(sulfonyl)diazomethane compound, a sulfone compound, an organic acid ester compound, an organic amide compound, an organic imide compound and the like. These can be used alone or in any suitable combination.

The organic solvent of the photosensitive resist composition may dissolve the alkali-soluble resin and the photoreactive compound. Preferably, the organic solvent of the photosensitive resist composition may not dissolve the alkali-soluble polymer of the non-photosensitive resist composition. When the alkali-soluble polymer of the non-photosensitive resist composition is dissolved by the organic solvent of the photosensitive resist composition, the first resist layer 170 is dissolved and damaged by the photosensitive resist composition since the photosensitive resist composition is coated on the first base substrate 110 having the first resist layer 170. Examples of the organic solvent of the photosensitive resist composition may include a polar solvent such as heptanone, cyclohexanone, 2-hydroxyisobutyric acid methyl ester, lactone and the like. These can be used alone or in any suitable combination.

The non-photosensitive resist composition is deposited over the passivation layer 160, preferably as a uniform coat, such as through a spin-coating process or a slit-coating process. Thereafter, the non-photosensitive resist composition is heated to form the first resist layer 170.

Another photosensitive resist composition is deposited on the first resist layer 170, again preferably as a uniform coat, through processes such as a spin-coating process or a slit-coating process. The photosensitive resist composition is then heated to form the second resist layer 180. The photosensitive resist composition preferably includes a polar organic solvent, so that the first resist layer 170 may be prevented from being damaged by the photosensitive resist composition, and the second resist layer 180 may be more stably formed on the first resist layer 170.

Thereafter, a third mask MASK3 is disposed on the second resist layer 180. The third mask MASK3 includes a light-blocking portion 40, a semi-transmitting portion 50, and an opening portion 60. The light-blocking portion 40, the semi-transmitting portion 50, and the opening portion 60 of the third mask MASK3 may have substantially the same function as the light-blocking portion 10, the slit portion 20 and the light-transmitting portion 30 of the second mask MASK2. Thus, any redundant explanation will be omitted. The semi-transmitting portion 50 of the third mask MASK3 may include a plurality of slits.

The opening portion 60 is disposed on the second resist layer 180 to overlap with the drain electrode 155 of the contact area CA, the gate pad electrode 121 and the data pad electrode 157. The semi-transmitting portion 50 is disposed on the second resist layer 180 to overlap with the pixel electrode area PA of the first base substrate 110. The light-blocking portion 40 is disposed on the second resist layer 180 to overlap with a remaining area excluding areas overlapped with the semi-transmitting portion 50 and the opening portion 60.

Figure 8:
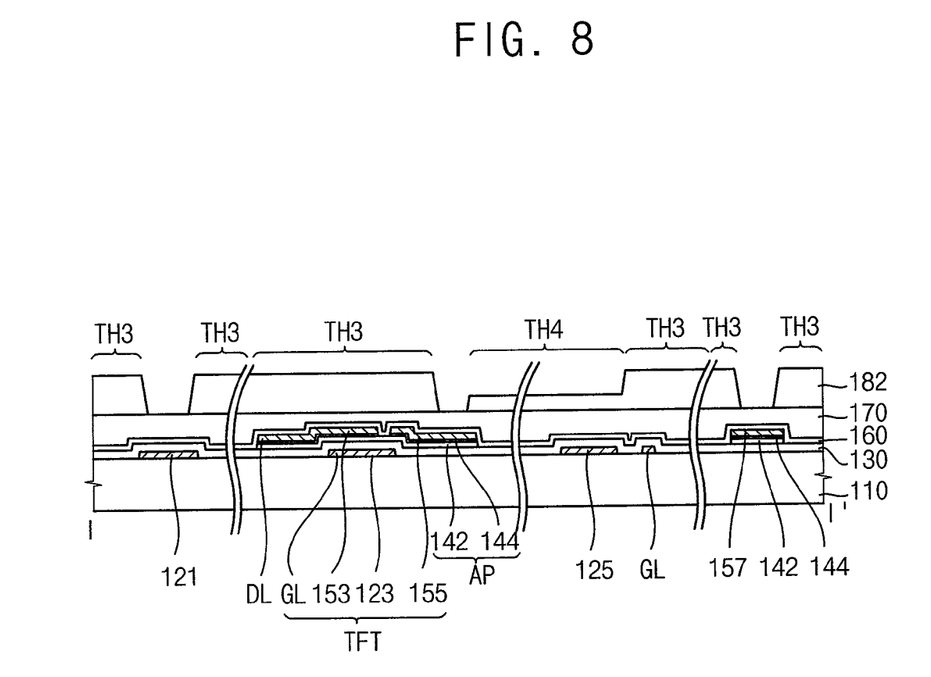

Referring to FIG. 8, light is irradiated onto the third mask MASK3 so that the second resist layer 180 is exposed to the light. Thereafter, a developing solution is provided to the first base substrate 110 so that an etch-stop pattern 182 is formed on the first resist layer 170. Preferably, the developing solution may include an alkali solution for dissolving those portions of the second resist layer 180 that were exposed to light, thus forming etch-stop pattern 182 and exposing portions of the first resist layer 170.

The etch-stop pattern 182 protects portions of the first resist layer 170 and of the passivation layer 160 which are disposed under the etch-stop pattern 182. Thus, neither the protected portions of the first resist layer 170 nor the protected portions of the passivation layer 160 are dissolved by the alkali solution.

The light-blocking portions 40 block light provided to areas of the second resist layer 180. These areas thus do not react with the light. The portions of the second resist layer 180 disposed under the light-blocking portion 40 are therefore not removed by the alkali solution, and remain on the first base substrate 110 to form a third thickness portion TH3.

Since an amount of light provided to a portion of the second resist layer 180 disposed under the semi-transmitting portion 50 is less than an amount of the light passing through the opening 60, an amount of the photosensitive compound having reactivity in the portion of the second resist layer 180 disposed under the semi-transmitting portion 50 is less than an amount of the photosensitive compound having reactivity in the portion of the second resist layer 180 disposed under the opening 60. Thus, the portion of the second resist layer 180 disposed under the semi-transmitting portion 50 is partially removed by the alkali solution to form a fourth thickness portion TH4. The thickness of the fourth thickness portion TH4 is less than the thickness of the third thickness portion TH3.

Figure 9:
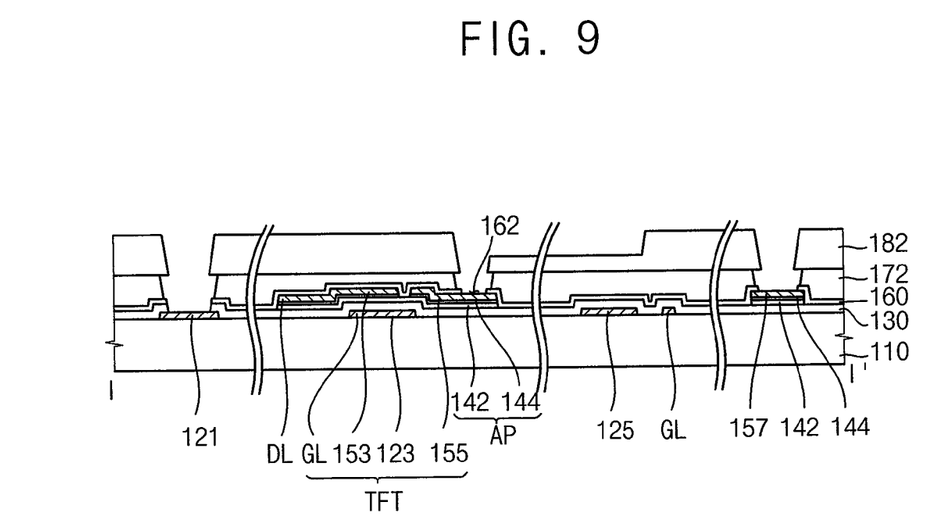

Referring to FIG. 9, the first resist layer 170 is continuously patterned with the etch-stop pattern 182 to form a resist pattern 172. Thereafter, a portion of the passivation layer 160 exposed to the etch-stop pattern 182 and the resist pattern 172 is removed to expose the drain electrode 155 in the contact area CA. For example, after the etch-stop pattern 182 is formed, when the alkali solution is provided to the first base substrate 110, the alkali solution may dissolve the first resist layer 170.

Light irradiated onto the second resist layer 180 through the third mask MASK3 is also irradiated onto the first resist layer 170, as a certain amount of light passes through the second resist layer 180. The first resist layer 170 may not include a photosensitive compound, unlike the second resist layer 180. Thus, even if the light is irradiated onto the first resist layer 170, the solubility of the first resist layer 170 may not change. However, a portion of the first resist layer 170 disposed under the etch-stop pattern 182 is protected by the etch-stop pattern 182, so that the portion of the first resist layer 170 disposed under the etch-stop pattern 182 is not exposed to the alkali solution. Thus, the portion of the first resist layer 170 disposed under the etch-stop pattern 182 remains over the passivation layer 160. More specifically, the portion of the first resist layer exposed by the etch-stop pattern 182 is etched by the alkali solution, forming resist pattern 172 and exposing the passivation layer 160 in the contact area CA.

It should also be noted that the first resist layer 172 is etched in a lateral direction, so that sidewalls of the resist pattern 172 are recessed from sidewalls of the etch-stop pattern 182. Therefore, an undercut is formed between the resist pattern 172 and the etch-stop pattern 182. The length of the undercut is defined by a depth of a recession of the resist pattern 172 with respect to the sidewalls of the etch-stop pattern 182, and the length of the undercut may depend on a time period during which the first resist layer 170 is exposed to the alkali solution. Alternatively, the length of the undercut may be changed depending on the solubility of the first resist layer 170 in the alkali solution or components of the non-photosensitive resist composition.

The portion of the first resist layer 170 overlapping the gate pad electrode 121 and the data pad electrode 157 is removed during etching. Thus, a portion of the passivation layer 160 overlapping the gate pad electrode 1221 and the data pad electrode 157 is exposed through the etch-stop pattern 182 and the resist pattern 172. This exposed portion of the passivation layer 160 is then selectively and anisotropically removed to form the illustrated contact hole 162 of width corresponding to the narrower width of the first layer opening in the etch-stop pattern 182, where this narrower width exposes an electrical continuation of the drain electrode 155 in the contact area CA. At the same time, the portion of the passivation layer 160 overlapping the data pad electrode 157 is removed to expose the data pad electrode 157. Furthermore, the portion of the passivation layer 160 overlapping the gate pad electrode 121 and a portion of the gate insulation layer 130 overlapping the gate pad electrode 121 are removed to expose the gate pad electrode 121.

Figure 10:
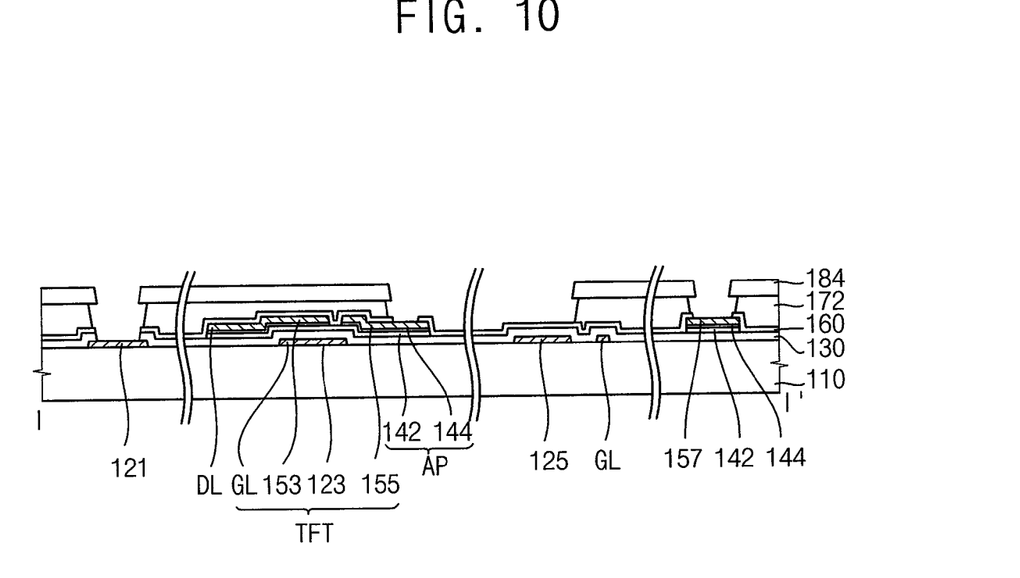

Referring to FIG. 10, the fourth thickness portion TH4 of the etch-stop pattern 182 and the resist pattern 172 disposed under the fourth thickness portion TH4 are removed, and a portion of the third thickness portion TH3 of the etch-stop pattern 182 is removed to form a remaining pattern 172 and 184. The passivation layer 160 overlapping the pixel electrode area PA is exposed through the remaining pattern 172 and 184.

Figure 11:
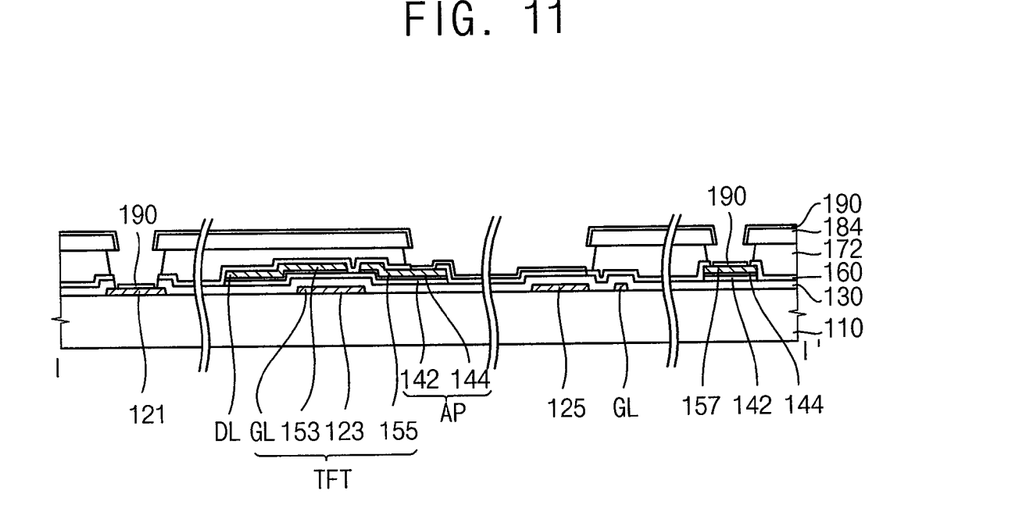

Referring to FIG. 11, a transparent electrode layer 190 is formed over layer 184. The transparent electrode layer 190 may include a transparent conductive material. Examples of a material that may be used for the transparent electrode layer 190 may include indium tin oxide (ITO), indium zinc oxide (IZO) and the like.

The transparent electrode layer 190 makes contact with the drain electrode 155 through the contact hole 162, the passivation layer 160 in the pixel electrode area PA, and the upper surface of layer 184. Furthermore, the transparent electrode layer 190 makes contact with the gate pad electrode 12 and the data pad electrode 157.

Sidewalls of the lower remaining pattern 172 are recessed from sidewalls of the upper remaining pattern 184, so that portions of transparent electrode layer 190 formed on the surface and the sidewalls of the upper remaining surface 184 are separated from (i.e., having a step discontinuity to) portions of the transparent electrode layer 190 formed on the passivation layer 160 in the pixel electrode layer PA, the contact hole 162, the gate pad electrode 121 and the data pad electrode 157.

Thereafter, the remaining patterns 172 and 184 are removed to form a pixel electrode PE, a first transparent electrode 192 and a second transparent electrode 194. For example, a alkalisolution such as TMAH (tetramethyl ammonium hydroxide) may be applied to remove the remaining patterns 172 and 184, as well as the portion of the transparent electrode layer 190 formed on the upper remaining pattern 184. After the portion of the transparent electrode layer 190 formed on the upper remaining pattern 184 is removed, the remaining portions of transparent electrode layer 190 form the pixel electrode PE, the first transparent electrode 192 and the second transparent electrode 194. As a result, a process of patterning the passivation layer 160 and a process of patterning the transparent electrode layer 190 may be performed by using one mask—MASK3.

Hereinafter, a method of manufacturing a display apparatus according to an example embodiment of the present invention will be explained in detail. The display substrate used in the display apparatus can be fabricated as described above, in connection with FIGS. 3 to 11. Thus, any detailed explanation concerning the method of manufacturing a display substrate is omitted.

Referring to FIGS. 2 and 3 to 11, a display substrate 100 is prepared according to the above-explained method of manufacturing a display substrate. In order to manufacture an opposing substrate 300, a black matrix pattern BM, a color filter 320, an overcoating layer 330, and a common electrode 340 are formed on a second base substrate 310.

For example, a metal layer is formed on the second base substrate 310. The metal layer is patterned through photolithography to form the black matrix pattern BM. A color photoresist layer is formed on the second base substrate 310 and patterned to form the color filter 320. The overcoating layer 330 and the common electrode layer 340 are then sequentially formed. Thereafter, the display substrate 100 and the opposing substrate 300 are combined with each other. Liquid crystal is provided between the display substrate 100 and the opposing substrate 300 to form a liquid crystal layer 400.

According to the above, the number of masks required for manufacturing a display substrate according to the above methods (three) is reduced, relative to the number currently required (commonly, five). This reduces process cost, time, and complexity. Furthermore, an undercut between an etch-stop pattern and a resist pattern may be easily formed without over-etching a passivation layer. Thus, damage to a drain electrode, a gate pad electrode and a data pad electrode may be reduced and/or prevented.

Furthermore, the reliability and the process margin in a process of patterning a transparent electrode layer for forming a transparent electrode may be improved, since the undercut may be easily formed and the length of the undercut may be controlled.

In an example embodiment of the present invention, a three-mask process is described. Thus, an active layer and a data metal layer are patterned by using the same mask to form an active pattern, a data line, a source electrode, a drain electrode and a data pad electrode. Alternatively, an example embodiment of the present invention may be applied to a four-mask process. For example, a gate metal layer is patterned by using a first mask to form a gate line and a gate electrode. An active layer is patterned by using a second mask to form an active pattern. A data metal layer is patterned by using a third mask to form a data line, a source electrode, a drain electrode and a data pad electrode. A passivation layer and a transparent electrode layer are patterned by using a fourth mask, a first resist layer and a second resist layer. As a result, a display substrate including a switching device may be manufactured, and reliability and the process margin for manufacturing a display substrate may be improved.

The foregoing is illustrative of the present disclosure of invention and is not to be construed as limiting thereof. Although a few example embodiments have been described, those skilled in the art will readily appreciate in light of the foregoing that many modifications are possible in the example embodiments without materially departing from the novel teachings and advantages of the present disclosure of invention. Accordingly, all such modifications are intended to be included within the scope of the present teachings. In the claims, means-plus-function clauses are intended to cover the structures described herein as performing the recited function and not only structural equivalents but also equivalent structures.

What is claimed is:

1. A method of manufacturing a display substrate, the method comprising:
    forming a gate line, a data line crossing the gate line, and a switching device on a base substrate, the switching device electrically connected to the gate line and the data line;
    sequentially forming a passivation layer, a first resist layer, and a second resist layer on the base substrate;
    patterning the second resist layer using a developing solution to form an etch-stop pattern;
    patterning the first resist layer using the etch-stop pattern and the developing solution to form a resist pattern, the etch-stop pattern having a sidewall protruding over a sidewall of the resist pattern;
    after the patterning the first resist layer, removing a portion of the passivation layer using the resist pattern and the etch-stop pattern to form a contact hole on a drain electrode of the switching device;
    forming a pixel electrode electrically connected to the switching device through the contact hole; and
    removing the first and second resist layers,
    wherein the first resist layer comprises a non-photosensitive resist composition, and the second resist layer comprises a photosensitive resist composition.

2. The method of claim 1, wherein the non-photosensitive resist composition comprises:
    an alkali-soluble polymer having a repeating unit including at least one of a hydroxyl group and a carboxyl group; and
    an organic solvent.

3. The method of claim 2, wherein the photosensitive resist composition comprises:
    an alkali-soluble resin containing a phenol-based hydroxyl group;
    a photoreactive compound; and
    an organic solvent configured to dissolve the alkali-soluble polymer and the photoreactive compound without dissolving the alkali-soluble polymer of the non-photosensitive resist composition.

4. The method of claim 3, wherein the organic solvent of the photosensitive resist composition comprises at least one of heptanone, cyclohexanone, 2-hydroxyisobutyric acid methyl ester and lactone.

5. The method of claim 1, wherein patterning the second resist layer further comprises:
- irradiating light onto the base substrate through a mask disposed on the base substrate; and
- developing the second resist layer with the developing solution to form the etch-stop pattern; and
- wherein the patterning the first resist layer further comprises dissolving a portion of the first resist layer exposed through the etch-stop pattern using the developing solution, so as to form the resist pattern.

6. The method of claim 1, wherein the patterning further comprises forming the etch-stop pattern by developing the second resist layer to form a first thickness layer and a second thickness layer, the first thickness layer at least partially overlapping the gate line, the data line and the switching device, the second thickness layer at least partially overlapping a pixel electrode area.

7. The method of claim 6, wherein the forming a pixel electrode further comprises:
- removing the second thickness portion, a portion of the resist pattern formed on the pixel electrode area, and a portion of the first thickness portion, so as to form a remaining pattern exposing the passivation layer on the pixel electrode area;
- forming a transparent electrode layer on the base substrate, the transparent electrode layer making contact with the drain electrode of the switching device; and
- removing a portion of the transparent electrode layer on the remaining pattern, so as to pattern the transparent electrode layer.

8. The method of claim 7, wherein the portion of the transparent electrode layer formed on the remaining pattern is separate from a portion of the transparent electrode layer formed on the passivation layer.

9. The method of claim 7, wherein the forming of the switching device further comprises:
- forming the gate line and a gate electrode of the switching device, the gate electrode of the switching device being connected to the gate line;
- forming a gate insulation layer on the gate line and the gate electrode; and
- forming the data line, a source electrode of the switching device, and the drain electrode, the source electrode being connected to the data line, the drain electrode being spaced apart from the source electrode.

10. The method of claim 9, wherein one or more of the resist pattern and the etch-stop pattern exposes portions of the passivation layer that are formed on a gate pad electrode and a data pad electrode.

11. The method of claim 10, further comprising:
- removing portions of the gate insulation layer and the passivation layer that are formed on the gate pad electrode; and
- removing a portion of the passivation layer formed on the data pad electrode.

12. The method of claim 11, wherein the pixel electrode includes a first transparent electrode making contact with the gate pad electrode, and a second transparent electrode making contact with the data pad electrode.

13. The method of claim 12, wherein the transparent electrode layer formed on the remaining pattern is separated from the first transparent electrode due to a step discontinuity between the first transparent electrode and the transparent electrode layer formed on the remaining pattern, and the transparent electrode layer formed on the remaining pattern is separated from the second transparent electrode due to a step discontinuity between the second transparent electrode and the transparent electrode layer formed on the remaining pattern.

14. A method of manufacturing a display apparatus, the method comprising:
- on a first base substrate, forming a gate line, a data line crossing the gate line, and a switching device electrically connected to the gate line and the data line;
- sequentially forming a passivation layer, a first resist layer and a second resist layer on the first base substrate;
- patterning the second resist layer using a developing solution to form an etch-stop pattern;
- patterning the first resist layer using the etch-stop pattern and the developing solution to form a resist pattern, the etch-stop pattern having a sidewall protruding from a sidewall of the resist pattern;
- after the patterning the first resist layer, removing a portion of the passivation layer using the resist pattern and the etch-stop pattern, to form a contact hole on a drain electrode of the switching device;
- forming a pixel electrode electrically connected to the switching device through the contact hole;
- forming a common electrode layer on a second base substrate, wherein the second base substrate is facing the first base substrate; and
- removing the first and second resist layers,
- wherein the first resist layer comprises a non-photosensitive resist composition and the second resist layer comprises a photosensitive resist composition.

15. The method of claim 14, wherein the non-photosensitive resist composition comprises:
- an alkali-soluble polymer having a repeating unit including at least one of a hydroxyl group and a carboxyl group; and
- an organic solvent.

16. The method of claim 15, wherein the photosensitive resist composition comprises:
- an alkali-soluble resin including a phenol-based hydroxyl group;
- a photoreactive compound; and
- an organic solvent configured to dissolve the alkali-soluble polymer and the photoreactive compound without dissolving the alkali-soluble polymer of the non-photosensitive resist composition.

17. The method of claim 16, wherein the organic solvent of the photosensitive resist composition comprises at least one of heptanone, cyclohexanone, 2-hydroxyisobutyric acid methyl ester, and lactone.

* * * * *